United States Patent [19]

Moritz et al.

[11] 4,104,070
[45] Aug. 1, 1978

[54] METHOD OF MAKING A NEGATIVE PHOTORESIST IMAGE

[75] Inventors: Holger Moritz, Holzgerlingen, Fed. Rep. of Germany; Gabor Paal, Fishkill, N.Y.

[73] Assignee: International Business Machines Corporation, Armonk, N.Y.

[21] Appl. No.: 682,804

[22] Filed: May 3, 1976

[30] Foreign Application Priority Data

Jun. 30, 1975 [DE] Fed. Rep. of Germany ....... 2529054

[51] Int. Cl.² ................................................. G03C 5/00
[52] U.S. Cl. ........................................ 96/36; 96/36.2; 96/49; 96/91 D; 427/43
[58] Field of Search ............ 96/49, 36, 36.2, 33, 96/86 P, 91 D; 156/13, 14, 15; 427/43

[56] References Cited

U.S. PATENT DOCUMENTS

| | | | |
|---|---|---|---|
| 3,264,104 | 8/1966 | Reichel | 96/91 D |
| 3,406,065 | 10/1968 | Uhlig | 96/91 D |
| 3,759,711 | 9/1973 | Rauner et al. | 96/91 D |
| 3,827,908 | 8/1974 | Johnson et al. | 96/91 D |
| 3,873,313 | 6/1975 | Horst et al. | 96/36 |
| 3,890,152 | 6/1975 | Ruckert et al. | 96/33 |

OTHER PUBLICATIONS

Dinaburg; M. S., "Photosensitive Diazo Cpds", The Focal Press, 1964, pp. 190–196.

*Primary Examiner*—Charles L. Bowers, Jr.
*Attorney, Agent, or Firm*—David M. Bunnell

[57] ABSTRACT

The invention relates to a method of making a negative photoresist image on a substrate, where a normally positive working photoresist material containing 1-hydroxyethyl-2-alkyl-imidazoline is applied to a substrate, image-wise exposed with actinic radiation, heated, and blanket exposed to actinic radiation. The material which was not exposed originally is then removed with a solvent to give a negative image.

5 Claims, 1 Drawing Figure

```
┌─────────────────────────────────────┐
│   MAKING A MIXTURE OF A POSITIVE    │
│  WORKING PHOTORESIST CONTAINING A   │
│  DIAZONAPHTHOQUINONE SENSITIZER,    │
│    WITH 1-HYDROXYETHYL-2-ALKYL-     │
│            IMIDAZOLINE.             │
└─────────────────────────────────────┘
                   │
┌─────────────────────────────────────┐
│    PROVIDING A LAYER ON THE WAFER   │
│   BY MEANS OF SPIN COATING OF THE   │
│         MODIFIED PHOTORESIST.       │
└─────────────────────────────────────┘
                   │
┌─────────────────────────────────────┐
│      PREBAKING OF THE PHOTORESIST   │
│           BY MEANS OF HEATING.      │
└─────────────────────────────────────┘
                   │
┌─────────────────────────────────────┐
│          IMAGE-WISE EXPOSURE.       │
└─────────────────────────────────────┘
                   │
┌─────────────────────────────────────┐
│      CROSS-LINKING THE PHOTORESIST  │
│         IN THE EXPOSED AREAS OF     │
│       STEP 4 BY MEANS OF HEATING.   │
└─────────────────────────────────────┘
                   │
┌─────────────────────────────────────┐
│       BLANKET EXPOSURE OF THE       │
│          PHOTORESIST LAYER.         │
└─────────────────────────────────────┘
                   │
┌─────────────────────────────────────┐
│    DEVELOPMENT BY MEANS OF IMMERSION│
│         IN AN ALKALINE DEVELOPER.   │
└─────────────────────────────────────┘
```

METHOD OF MAKING A NEGATIVE PHOTORESIST IMAGE

In the production of monolithic circuits, photosensitive photoresist materials play an important part. The use of such photoresist materials in the circuit technology is based on their property to permit the "engraving" of circuit images of predetermined dimensions in a predetermined monolithic substrate material as, e.g., silicon. This is performed by means of a photolithographic process, where by photographic means a pattern corresponding to the circuit design is imaged by means of a suitable mask on the substrate surface. The photoresist supplies the required photo sensitive layer. By means of a subsequent developing process, the desired resist patterns are formed on the substrate surface. The substrate can then be etched in the uncovered areas by suitable processes to form, for example, a diffusion mask. In this process, the photoresist has the function of a protective resist system for the substrate surface areas which have not been uncovered by the preceding photolithographic process.

According to their interaction with light, a distinction is made between negative and positive photoresist systems. The term negative refers to a photoresist which after exposure in a suitable solvent is insoluble, whereas the unexposed resist zones are dissolved by the developer. As a result, free and unprotected zones are obtained on the substrate surface which correspond to the opaque dark parts of the photomask. Examples of negative working photoresist systems are photoresist materials based on partly cyclized cis-1,4-polyisoprene with a di-azidobenzal-alkyl-cyclohexanone as photoinitiator. In a positive working photoresist system, the photoresist system is altered upon exposure in such a manner that it is subsequently soluble in the developer (e.g., aqueous buffered alkali). The exposed areas of the photoresist film are removed upon developing, and the free unprotected areas on the substrate surface correspond to the transparent parts on the photomask. Examples of positive working photoresist systems are photoresist materials based on phenol-formaldehyde resins (novolak type) with a suitable molecular weight distribution, which contain a photoactive compound, a so-called sensitizer, for instance of the group of the 4 or 5-substituted diazo-naphthoquinones, such as naphthoquinone (1,2)-diazide-sulfonic acid esters.

Another photoresist system has already been suggested which permits the forming of a single photosensitive layer on a substrate surface with both negative and positive developing ability. This is a photoresist based on spiropyrane which according to the developer (polar or apolar) can be developed to form either a positive or a negative image. A disadvantage of this photoresist is its low sensitivity and its unsatisfactory resistance against the etching chemicals which are used for etching the desired surface structures into the dielectric layer.

Copending application Ser. No. 639,536 filed Dec. 10, 1975, now U.S. Pat. No. 4,007,047, which is a continuation of application Ser. No. 476,831 filed June 6, 1974, now abandoned entitled "Modified Processing of Positive Photoresists" describes a process where positive resists are subjected to an acid treatment after image-wise exposure which permits a negative image to be developed following a blanket exposure.

From German Offenlegungsschrift No. 2,361,436 (corresponding to U.S. Pat. No. 3,827,908) a process is known where, for improving the adhesion of positive working resist materials to silicon dioxide surfaces, 1-hydroxyethyl-2-alkylimidazolines are admixed with the positive working photoresist, the alkyl group being such that it can be saturated or unsaturated with 7 to 21 carbon atoms. Wafers with a silicon dioxide layer are coated with the thus modified photoresist, the photoresist layer is prebaked in a known manner, exposed image-wise, developed and postbaked. This Offenlegungsschrift does not give any indication as to what steps an expert should take to produce, with this modified positive working photoresist material, a negative photoresist image.

SUMMARY OF THE INVENTION

It is the object of the invention to provide a method for making a negative photoresist image using a positive working photoresist material with a 1-hydroxyethyl-2-alkylimidazoline content.

The object of the invention is achieved in that the photoresist layer, after image-wise exposure, is heated for a sufficient period of time to a sufficient temperature to render the exposed areas insoluble in alkaline developer, and subsequently blanket exposed with actinic radiation.

In an advantageous embodiment of the invention the photoresist layer is heated, after image-wise exposure, for about 10 to 20 minutes to approximately 110° C. After this thermal treatment it is blanket exposed for about 24 seconds, and developed in buffered alkaline developer.

By means of the process according to the invention, a negative photoresist image is obtained which is superior to the photoresist images produced with the formerly known negative working photoresist materials. The photoresist images obtained show for instance better resolution and less defects. Furthermore, the modified positive working photoresist used is not sensitive to oxygen in its processing, contrary to the hitherto known negative working photoresist materials. Etching masks made in accordance with the invention adhere excellently, and the etched structures are thus of considerable dimensional stability.

By means of the process according to the invention, a negative image can be made of a photomask. If there are no thermal treatment and blanket exposure after the image-wise exposure, it is also possible to make a positive image of the same mask. With the modified positive working photoresist, positive images can thus be made, and with the application of the process according to the invention negative images can be made using the same mask, so that in mask production repeated recopying is no longer necessary.

The modified photoresist can also be exposed with electron beams. In electron beam exposure systems, the exposure time depends directly on the size of the area to be exposed. If therefore in the making of an etching mask the larger part of a chip is to be exposed it is possible, when using a negative working photoresist, to expose the complementary areas in order to obtain the desired etching mask with a shorter exposure time. Owing to their low resolution, however, negative working resist materials are less suitable for making etching masks. With the modified photoresist, the desired etching masks can be similarly made, by the process according to the invention, with a shorter exposure time.

DESCRIPTION OF THE DRAWING

The FIGURE is a flow chart illustrating an embodiment of the process of the invention.

DETAILED DESCRIPTION

The invention will be described below in detail on the basis of the following specific description and the example.

According to the preferred embodiment of the invention, as shown in the flow-chart of the FIG. 1, a negative photoresist image is made as follows:

Step 1

The modified positive working photoresist is made in that a suitable positive working photoresist material, e.g., a phenol-formaldehyde resin with a diazo-naphthoquinone sensitizer which is described in U.S. Pat. No. 3,201,239, is mixed with 1 percent by weight Monazoline C (Mona Ind., Inc., Patterson, New Jersey).

Monazoline C which is identified as 1-hydroxyethyl-2-alkyl imidazoline, is described with more detail in Mona Industries, Inc. Technical Bulletin 280 b, November 1966. It has the following structural formula:

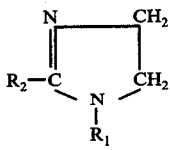

where $R_1$ is a hydroxyethyl group and $R_2$ an alkyl residue with 7 to 17 carbon atoms.

Step 2

A thin photoresist film is applied onto a silicon wafer covered with a thermally produced silicon dioxide layer, by means of a spin coating process.

Step 3

The photoresist film is prebaked for 10 minutes at 105° C under nitrogen.

Step 4

The photoresist film is image-wise exposed through a mask. The radiation source used is a 200 W mercury high pressure lamp. Exposure can also take place in an electron beam exposure system. In the image-wise exposed areas, the photoresist is decomposed, i.e., the diazonaphthoquinone sensitizer is degraded.

Step 5

The image-wise exposed photoresist film is heated to 105° C for 10 minutes. Under these conditions, there is a reaction in the photoresist in the areas exposed in Step 4, so that these areas become insoluble in the alkaline developer. This process will in the following be called cross-linking.

Step 6

After thermal treatment, the photoresist film is blanket exposed. During this exposure, the photoresist is decomposed also in those areas which had not been exposed in the image-wise exposure of Step 4, i.e., the diazonaphthoquinone sensitizer, under the influence of light, is degraded with ring contraction to indenecarboxylic acid. In the prior exposed areas of Step 4, there is no major change caused by the blanket exposure.

Step 7

In accordance with standard technology, the photoresist material, with a developer based on sodium hydrogen phosphate, sodium metasilicate, sodium hydroxide, is developed into a negative photoresist image.

Wafers processed in this way can be etched in a generally applied manner in a hydrofluoric acid etching solution buffered with ammonium fluoride.

EXAMPLE 1 percent by weight Monazoline C (Mona Ind., Inc., Paterson, New Jersey) which is a 1-hydroxyethyl-2-alkylimidazoline with a $C_7$ to $C_{17}$ alkyl residue, is added to the undiluted AZ-1350 H photoresist (Shipley Company, Inc., Newton, Mass.), a photosensitive phenol formaldehyde resin with a diazonaphthoquinone sensitizer which is identified as mixed esters of 2,3,4-trihydroxybenzophenone and 1-oxo-2-diazonaphthalene-5-sulfonic acid. The mixture is filtered through a filter with a pore diameter of 1 μm and then applied onto a silicon wafer with a thermally generated silicon dioxide layer by means of a spin coating process with 3,800 revolutions/min. The coated wafer is prebaked for 10 minutes at 105° C in nitrogen atmosphere.

Subsequently, the photoresist layer is image-wise exposed through a mask, in an SLT mask alignment and exposure device which is equipped with a 200 W mercury high pressure lamp. The exposure time is 24 seconds approximately. Under the given conditions, there occurs in the exposed areas a decomposition of the sensitizer which corresponds to the ring contraction and forming of indene carboxylic acid taking place under the influence of UV light on diazonaphthoquinone. During exposure, the diazonaphthoquinone sensitizer is degraded to about 10% of its original concentration, i.e., that prior to the exposure.

Subsequently, the coated wafer is heated for 10 minutes to 105° C. In the unexposed areas covered by the mask, no significant reaction occurs except for a further drying. In those areas where the photoresist layer, owing to the imagewise exposure, was made soluble in an alkaline developer, (developer on the basis of sodium hydrogen phosphate, sodium metasilicate, and sodium hydroxide) there now is a crosslinking, i.e., the photoresist is rendered insoluble by the thermal processing. After the thermal processing, the coated wafer is blanket exposed. The exposure time is also 24 seconds. Those areas of the photoresist layer which during the first exposure were exposed image-wise and rendered insoluble through the thermal processing, do not react any further to a considerable extent. In those areas, which during the first exposure had been covered by the mask, the diazonaphthoquinone sensitizer is degraded as specified above, during the second blanket exposure. Through this degrading, these areas are rendered soluble in an alkaline developer based on sodium hydrogen phosphate, sodium metasilicate, and sodium hydroxide. For the removal of the soluble areas, the processed wafers are immersed for one minute in an alkaline developer, the AZ-developer (sodium metasilicate, sodium phosphate, and sodium hydrogen phosphate) of Shipley Co., Inc., which had been mixed with distilled water in a volume ratio of 1:1.

With a positive working photoresist system modified with 1-hydroxyethyl-2-alkyl-imidazoline, free and unprotected areas are obtained on the wafer of those places, according to the process of the invention, which correspond to the opaque, dark parts on the photomask. Generally, such photoresist images are obtained with negative working photoresist systems. If, on the other hand, there was no thermal processing and subsequent blanket exposure of the photoresist layer in accordance with the invention, free and unprotected areas on the wafer are obtained, as in general upon the use of positive working resist materials, in those places which correspond to the transparent, bright parts on the photomask.

What is claimed is:

1. A method of making a negative photoresist image on a substrate consisting essentially of the steps of:
    Applying to a substrate a layer of a positive working photoresist material consisting essentially of a phenolformaldehyde resin, a naphthoquinone (1,2) diazide sulfonic acid ester sensitizer, and a 1-hydroxyethyl-2-alkylimidazoline,
    imagewise exposing the layer with actinic radiation,
    heating the imagewise exposed layer for a sufficient period of time to a sufficient temperature to render the exposed areas insoluble in alkaline developer,
    subsequently blanket exposing the layer with actinic radiation and, removing the portions of the layer which were not exposed during the imagewise exposure with an alkaline developer.

2. The method of claim 1 wherein the 1-hydroxyethyl-2-alkylimidazoline corresponds to the formula

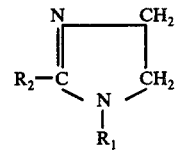

where $R_1$ represents a hydroxyethyl residue and $R_2$ an alkyl residue with 7 to 17 carbon atoms.

3. The method as of claim 2 wherein the alkyl residue contains 9 to 17 carbon atoms.

4. The method of claim 1, wherein the photoresist layer is heated to about 110° C for approximately 10 to 20 minutes after the imagewise exposure.

5. The method of claim 4 wherein, after the thermal processing, the photoresist layer is blanket exposed until the sensitizer is degraded to about 10% of its original concentration.

* * * * *